United States Patent [19]
Stacey et al.

[11] Patent Number: 5,798,916
[45] Date of Patent: Aug. 25, 1998

[54] HIGH POWER INVERTER POLE EMPLOYING SERIES CONNECTED DEVICES CONFIGURED FOR REDUCED STRAY LOOP INDUCTANCE

[75] Inventors: Eric John Stacey, Pittsburgh; George Studley Bettencourt, Murrysville, both of Pa.

[73] Assignee: Electric Power Research Institute, Inc., Palo Alto, Calif.

[21] Appl. No.: 822,372

[22] Filed: Mar. 20, 1997

[51] Int. Cl.⁶ .......................... H02H 7/122; H02M 3/24; H02M 7/515; H02M 1/06
[52] U.S. Cl. .................. 363/135; 363/57; 363/96; 363/138
[58] Field of Search ................ 363/57, 96, 135, 363/136, 138, 55, 56, 95, 98, 40, 58, 141, 144

[56] References Cited

U.S. PATENT DOCUMENTS

| | | | |
|---|---|---|---|
| 4,908,734 | 3/1990 | Fujioka | 361/383 |
| 5,321,598 | 6/1994 | Moran | 363/41 |
| 5,337,227 | 8/1994 | Stacey et al. | 363/71 |
| 5,343,139 | 8/1994 | Gyugyi et al. | 363/39 |
| 5,373,418 | 12/1994 | Hayasi | 361/707 |
| 5,497,289 | 3/1996 | Susgishima et al. | 361/709 |
| 5,544,035 | 8/1996 | Beriger et al. | 363/132 |
| 5,576,944 | 11/1996 | Uchino | 363/71 |

*Primary Examiner*—Peter S. Wong
*Assistant Examiner*—Bao Q. Vu
*Attorney, Agent, or Firm*—Richard V. Westerhoff; Eckert Seamans Cherin & Mellott, LLC

[57] ABSTRACT

A high power inverter pole for a voltage sourced inverter suitable for providing compensation in electric power transmission and distribution systems, has a positive switching valve and a negative switching valve connected between closely spaced dc-source terminal, respectively, and a common ac terminal to form a current loop with minimum loop area thereby reducing stray loop inductance and limiting the overshoot voltage on serially connected electronic switches which make up the valves. In a preferred embodiment, the valves are mounted on opposite sides of the web of an insulative I-beam. The electronic switches are incorporated in modular switching units connected in series by C-channel connecting conductors having flanges bolted to the I-beam flanges. The modular units include broad, flat conductors bolted through end flanges to the C-channel connecting conductors. The electronic switches and anti-parallel diodes of the modular units are clamped between these broad, flat conductors. Cooling water is circulated through the broad, flat conductors which serve as heat sinks as well as providing low inductance electrical connections. In another embodiment of the invention, sections of the positive and negative switching valves are folded back on themselves to minimize loop area and hence again, reduce stray loop inductance.

28 Claims, 9 Drawing Sheets

HIGH POWER INVERTER POLE EMPLOYING SERIES CONNECTED DEVICES CONFIGURED FOR REDUCED STRAY LOOP INDUCTANCE

BACKGROUND OF THE INVENTION

1. Field of the Invention

This invention relates generally to power electronic compensators for electric utility transmission and distribution systems. More particularly, this invention relates to very high power voltage sourced inverter poles employing a number of series connected semi-conductor switching devices.

2. Background Information

New applications of power electronic equipment to electric utility transmission and distribution systems will greatly improve the reliability and utilization of such systems. Some of these applications, such as the "Static VAR Compensator" (STATCON), employ voltage sourced inverters to control reactive power. Other applications use voltage sourced inverters which handle both real and reactive power to improve the control characteristics of individual transmission lines within a network. For distribution systems, large but somewhat smaller inverters used for similar purposes can also provide harmonic compensation for nonlinear loads.

To achieve the required power ratings, these inverters employ series connected switching devices to make up "high voltage valves." For distribution systems, pulse width modulated inverters rated from 1 to 10 MW typically operate from dc voltages of 2 to 6 kV and employ fast switching devices such as insulated gate bipolar transistors (GBTs). For very large transmission type applications, "Gate Turn-Off Thyristors" (GTOs) are used to make up high voltage valves capable of switching currents of 2–4 kA and blocking voltages of 10–20 kV.

Typically, in these applications, the inverter poles consist of two valves connected in series across a dc voltage source, with the ac output taken from the mid point. Complete inverters employ a number of inverter poles, usually in sets of three. The valves in these inverter poles switch alternately to produce square wave or pulse width modulated ac outputs. The phase shifted outputs of the multiple sets of poles are combined by special interface magnetics to produce a stepped approximation of a sine wave.

At each switching event, load current is commutated alternately from the valve connected to one dc bus to the other. When a valve turns off, its current is suddenly interrupted; however, because of stray inductance, this current cannot immediately be picked up by the oncoming valve and it will initially start to charge the capacitance which appears across the outgoing valve. If this capacitance is small and there is no damping, the voltage developed across the outgoing valve can significantly exceed the dc-source before the commutation is completed. To accommodate this overshoot, the voltage rating of the valve must be significantly greater than the dc-source voltage to which it is normally exposed. Depending on the type of switching devices employed, the overshoot voltage may be limited by different methods such as snubber capacitors and voltage clamping devices.

For high voltage applications, each of the valves is made up of a number of series connected switching devices. The number of devices required depends upon the withstand voltage of the device and the magnitude of the overshoot voltage.

The switching devices in each of the valves is shunted by an anti-parallel diode to accommodate for power factors other than one which result in a difference in polarity between the ac current and voltage during a portion of each cycle of the output. This can result in a momentary short circuit across the ac bus when the other valve turns on, until the anti-parallel diodes stop conducting. It is known to insert di/dt reactors in series on the dc side of the inverter to limit this current. These inverters are shunted by diodes and resistors to dissipate the energy stored during switching.

Despite efforts made to date to minimize the overshoot voltage imposed on the series connected devices of high power voltage sourced inverter poles, there is need for improvement.

There is also a need for reducing the overshoot voltage in such inverter poles without incurring substantial losses.

SUMMARY OF THE INVENTION

These need and others are satisfied by the invention which is directed to limiting the total unclamped stray loop inductance of a high power voltage sourced inverter pole in order to minimize the overshoot voltage during commutation. This is achieved by mounting positive and negative switching valves, each made up of a set of series connected switching units and connected between closely spaced, positive and negative dc terminals, respectively, and a common ac terminal, so as to form a loop with minimum loop area. In one embodiment of the invention, the positive and negative switching poles are connected back-to-back and extend linearly between the dc terminals and the ac terminals. In another embodiment, sections of the electrical path formed by each of the positive and negative poles are folded back on each other between the dc terminals and the ac terminal, again forming a loop with minimum loop area. To further reduce the stray loop inductance of the switching poles, the individual switching units of each of the switching valves are connected by broad, flat conductors which emulate a strip line. The width of these flat conductors is at least equal to the spacing between conductors on facing sides of the loop. Preferably, this aspect ratio of width to spacing is at least about 4 to 5:1.

As another aspect of the invention, an elongated insulative member is provided between the positive and negative switching valves to provide greater stand off voltage capability and, therefore, permit their being positioned close together to minimize the loop area. This elongated insulated member also serves as a mount for the positive and negative switching valves. In a particularly advantageous arrangement, this elongated electrically insulative member is configured as an I-beam which provides structural rigidity for the switching pole and, with the switching poles placed adjacent opposite sides of the beam web, the beam flanges provide increased creep distance between the positive and negative electrical paths.

An important aspect of the invention is that the switching units are modular and, therefore, can be separately tested and replaced as necessary. These modular switch units each comprise a switch, an anti-parallel diode shunting the switch, and a pair of spaced apart, flat conductors between which the switch and the anti-parallel diode are sandwiched. As in the case of the connecting conductors, the aspect ratio or width of these flat conductors to the spacing between them is at least equal to about 1:1 and preferably is at least 4 to 5:1. These flat conductors of the switch units serve as electrical conductors and heat sinks for the switch and the anti-parallel diode. Preferably, they have passages for circulating coolant to cool the switch and anti-parallel diode. The flat conductors of the modular switch units are connected to and extend transversely outward from the broad, flat connecting conductors of the switching valves which connect the modular switching units in series. The modular switching units further include snubber capacitors and resistors which are also connected by flat conductors to reduce stray loop inductance. The flat connecting conductors are preferably C-channel sections having channel flanges secured to the I-beam flanges and having channel webs adjacent the beam web. In this configuration, the metal C-channel connecting conductors strengthen the fiber glass I-beam.

The switching poles which are supported by the elongated insulative member such as an I-beam or back-to-back C-channels can be stacked one on top of each other, for instance to provide a six-pulse inverter bridge producing a three-phase ac output.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

Figure 1:
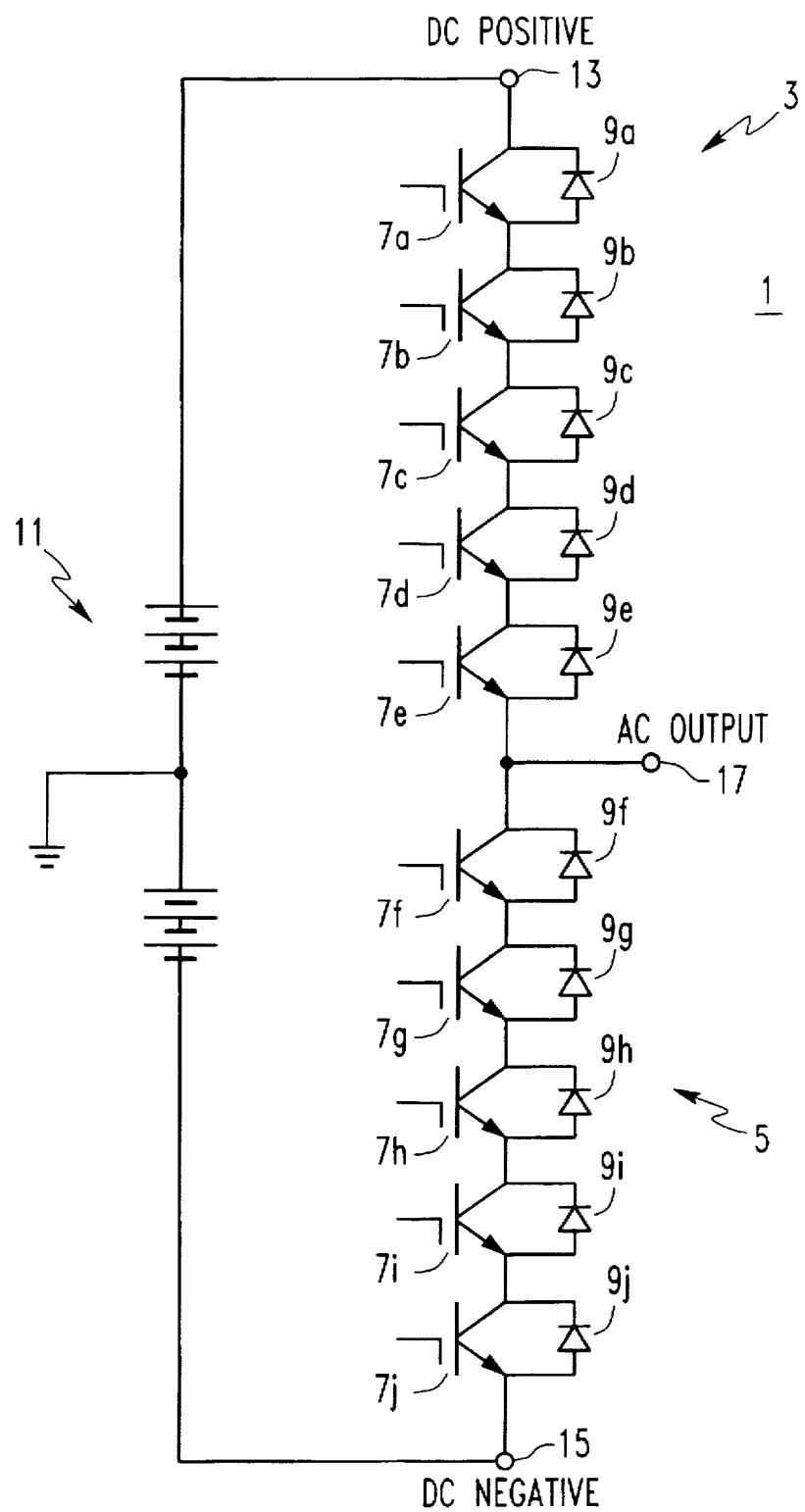
FIG. 1 is a simplified schematic diagram of a conventional prior art high voltage inverter pole.

FIG. 1 illustrates schematically a conventional high voltage inverter pole using series connected switches. This inverter switching pole 1 has a positive switching valve 3 and a negative switching valve 5, each made up of a number of series connected switches 7a–7j shunted by an anti-parallel diode 9a–9j. As previously discussed, the switches 7a–7j can be, for example, IGBTs for distribution systems and GTOs for transmission line applications. The switching pole 1 is fed by a dc source 11 through a positive dc terminal 13 and a negative dc terminal 15. The positive valve 3 and negative valve 5 are connected in series between the positive dc terminal 13 and negative dc terminal 15. The ac output is provided through an ac output terminal 17 connected at the mid point between the positive and negative valves 3 and 5. Typically, such conventional inverter switching poles are laid out without regard to stray inductance, for instance, such as in the arrangement shown in FIG. 1. That is, the positive and negative valves 3 and 5 are linearly connected between the spaced apart positive and negative dc terminals 13 and 15. We have recognized that this configuration results in high stray loop inductance which contributes to high overshoot voltage during switching of the switches 7a–7j. While snubber circuits and other electrical limiter components have been provided in attempts to control the overshoot voltage, we have been able to further reduce the overshoot voltage. Among the benefits of reduction in the overshoot voltage is the reduction in the number of switches 7a–7j required in a particular application.

Figure 2:
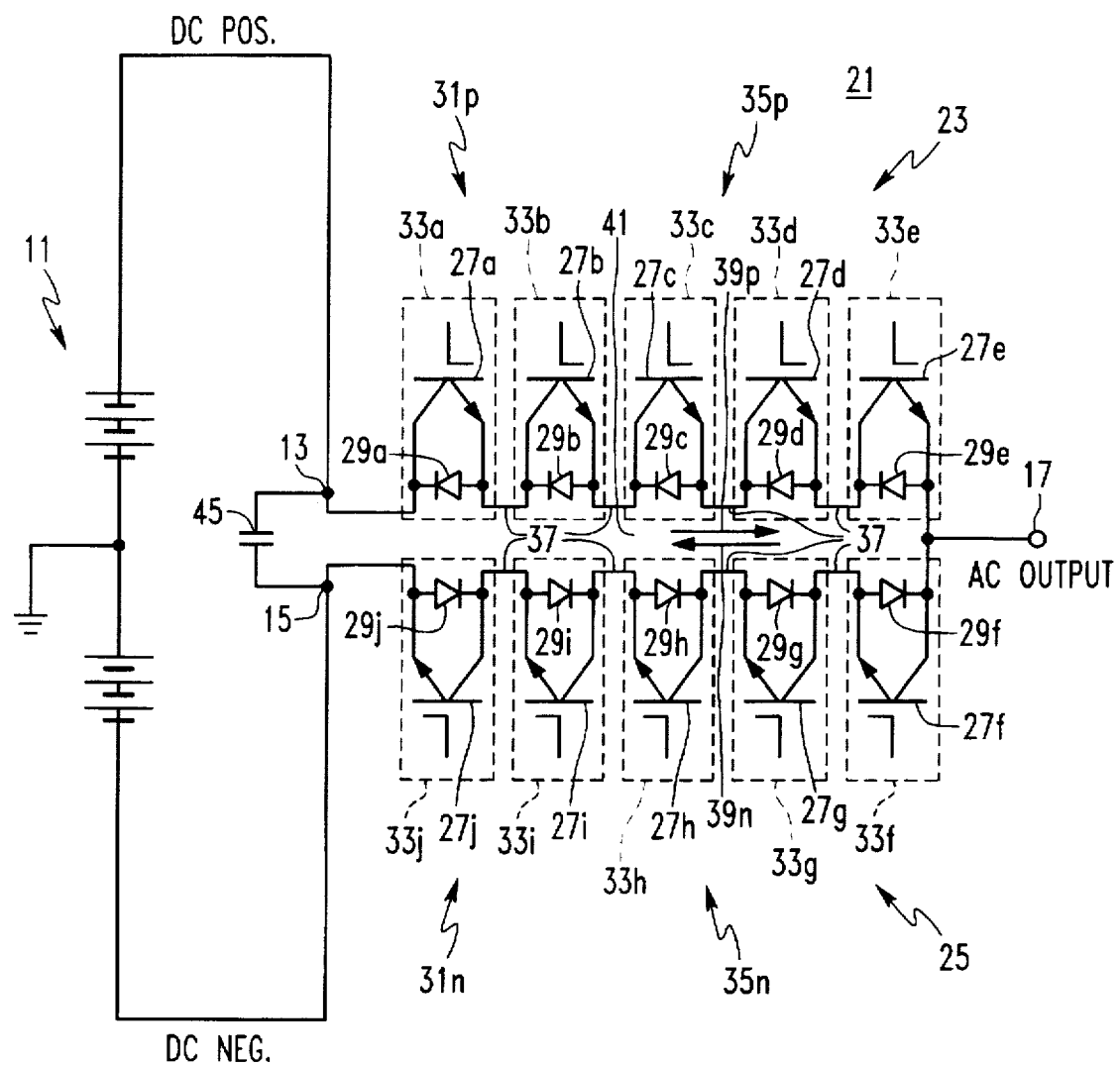
FIG. 2 is a simplified schematic diagram of a high voltage inverter switching pole in accordance with a first embodiment of the invention.

FIG. 2 illustrates schematically a first embodiment of the invention. This switching pole 21 also includes a positive switching valve 23 and a negative switching valve 25, each having a number of switches 27a–27j each shunted by an anti-parallel diode 29a–29j. Switches 27a–27e and their anti-parallel diodes 29a–29e form a first set 31p of switching units 33a–33e. These switching units 33a–33e are connected in series by a first set 35p of connecting conductors 37 to form a positive electrical path 39p. Similarly, the negative valve 25 is made up of a second set 31n of switch units 33f–33j which are connected in series by a second set 35n of connecting conductors 37 to form a negative electrical path 39n. In the inverter pole of FIG. 2, the positive terminal 13 and negative terminal 15 of the dc-source 11 are spaced close together and apart from the ac terminal 17. The positive switching valve 23 is connected linearly between the positive dc terminal 13 and the ac terminal 17, while the negative switching valve 25 is connected between the negative dc terminal 15 and the ac terminal 17. Thus, the positive switching valve and negative switching valve 25 are connected back-to-back with the positive electrical path 39p and the negative electrical path 39n, forming a loop 41 having a minimum loop area. A limiter 43 in the form of a dc voltage clamping capacitor 45 is connected across the closely spaced dc terminals 13 and 15. Other conventional limiters can be utilized, as will be discussed below.

Figure 3:
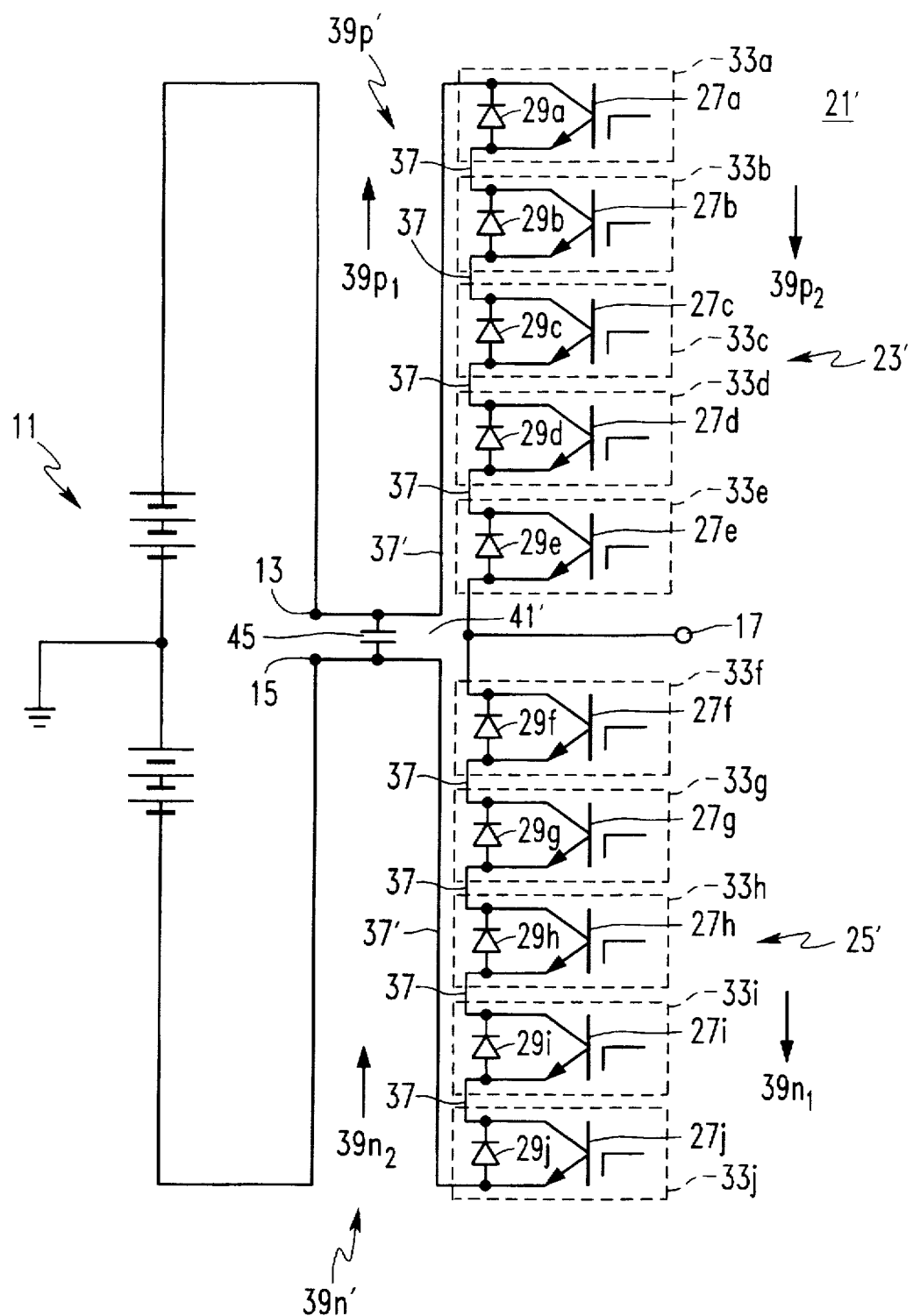
FIG. 3 is a simplified schematic diagram of a high voltage inverter switching pole in accordance with a second embodiment of the invention.

FIG. 3 illustrates another embodiment of a high power switching pole 21' for a voltage sourced inverter. In this arrangement, the positive electrical path 39p' of the positive switching valve 23' has a first section 39$p_1$ containing the switching units 33, and a second section 39$p_2$ made up only of an elongated connecting conductor 37' with the two sections folded back on each other between the positive dc terminal 13 and the ac terminal 17. Likewise, the negative electrical path 39n' is made up of two sections, 39$n_1$ containing the switching units 33 and 39$n_2$ made up of only an elongated connecting conductor 37. These electrical paths also form a loop 41' having minimum loop area thereby reducing the stray loop inductance of the switching pole 21'. In an alternative arrangement, not shown, the switching units 33 in each of the positive switching valve 23' and negative switching valve 25' can be distributed in both sections of the respective electrical paths. Again, the switching pole 21' is fed by the dc-source 11 through the dc terminals 13 and 15 which are closely spaced and across which a clamping capacitor 45 is connected.

Figure 4:
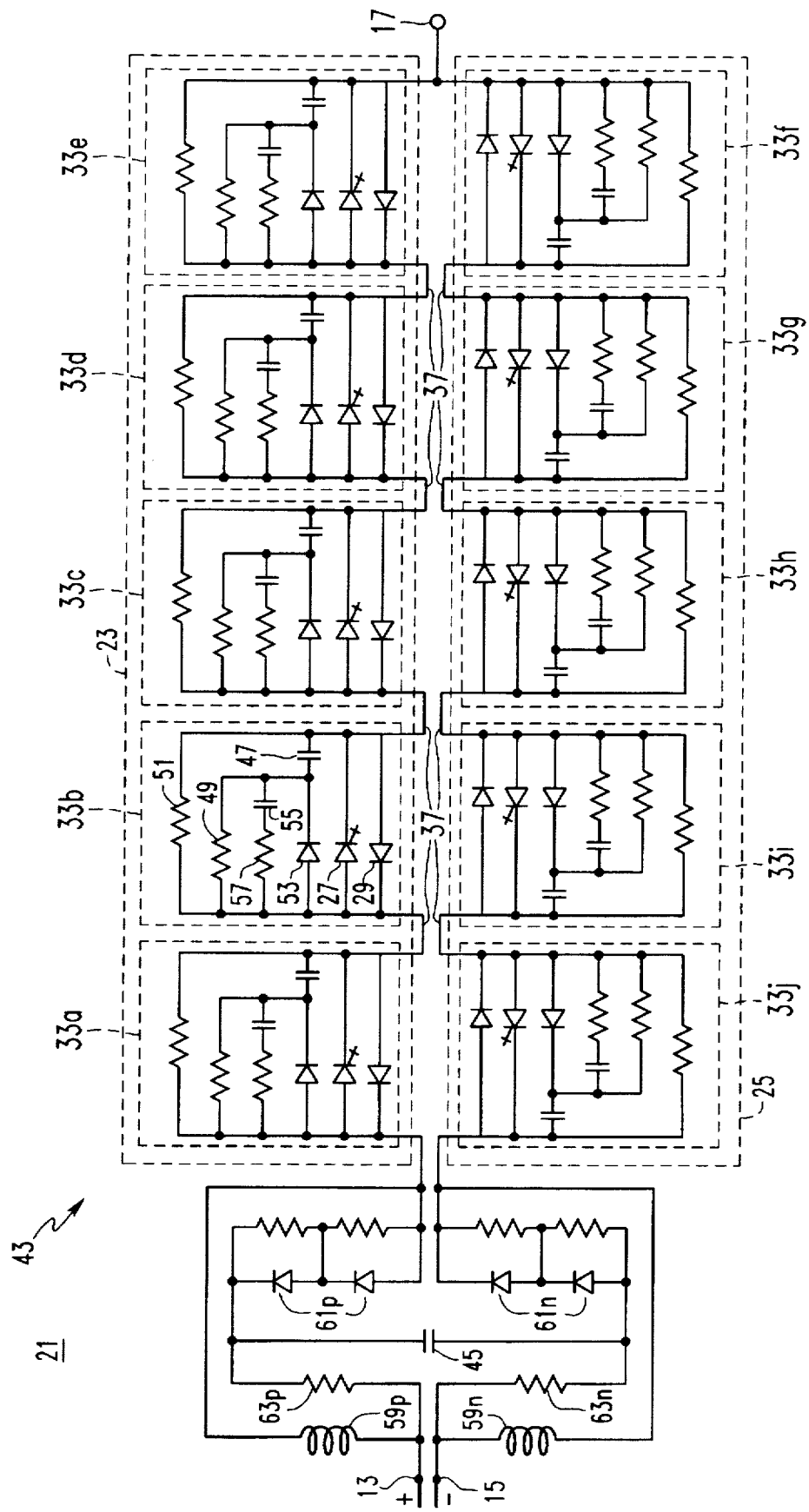
FIG. 4 is a more detailed schematic diagram of the embodiment of the switching pole shown in FIG. 2.

FIG. 4 is a more detailed schematic illustration of the switching pole 21 of FIG. 2. The switching units 33 which make up the positive valve 23 and negative valve 25, modular units which are easily inserted and removed through connections, to be described, to the connecting conductors 37. Each of the modular switching units 33 includes the switch 27 such as, for example. GTO or IGBT, shunted by an anti-parallel diode 29.

In order to limit the rise of voltage at turn-off of the switches 27, the limiter devices 43 include snubber capacitors 47 connected across the switches 27, so that when the switch turns off the current immediately begins to charge the capacitor 47. These snubbing capacitors 47 then discharge through a snubber discharge resistor 49 and a resistor 51 connected across the switch 27. This resistor 51 also serves to equalize dc voltage across the series connected switches 27. The limiter devices 43 also include a snubber diode 53 which prevents reverse flow of current when the switch 27 again turns on. A secondary snubber capacitor 55 prevents ringing when the snubber diode 53 suddenly blocks. A damping resistor 57 is connected in series with the secondary snubber capacitor 55.

As mentioned previously, means must be provided to limit the rate of change of current at turn on of the switches 27. Thus, the limiter devices 43 include a pair of air core reactors 59p and 59n connected in series with the positive switching valve 23 and negative switching valve 25, respectively. Because the current flowing in the di/dt reactors 59p and 59n cannot immediately change when a switch 27 blocks, it will continue to flow until it reaches zero. Normally, this would not occur until the voltage on the snubber capacitor 47 reaches a peak well above (typically as much as twice) the voltage of the dc-source 11, and the switches 27 would have to be rated to block this voltage.

In order to limit the voltage overshoot, diodes 61p and 61n can be connected to the larger clamping capacitor 45 which will charge relatively slowly to a voltage slightly above the dc-source voltage. The excess voltage on the capacitor 45 is then partially returned to the dc-source 11 through two damping resistors 63p and 63n. With this arrangement, the overshoot voltage is effectively limited, and some of the trapped energy is recovered. However, even with this known clamping circuit, there will be some voltage overshoot due to the self-inductance of the loop formed by the conductors connecting the switches to the clamping capacitor and the inductance of the clamping capacitor itself.

Figure 5:
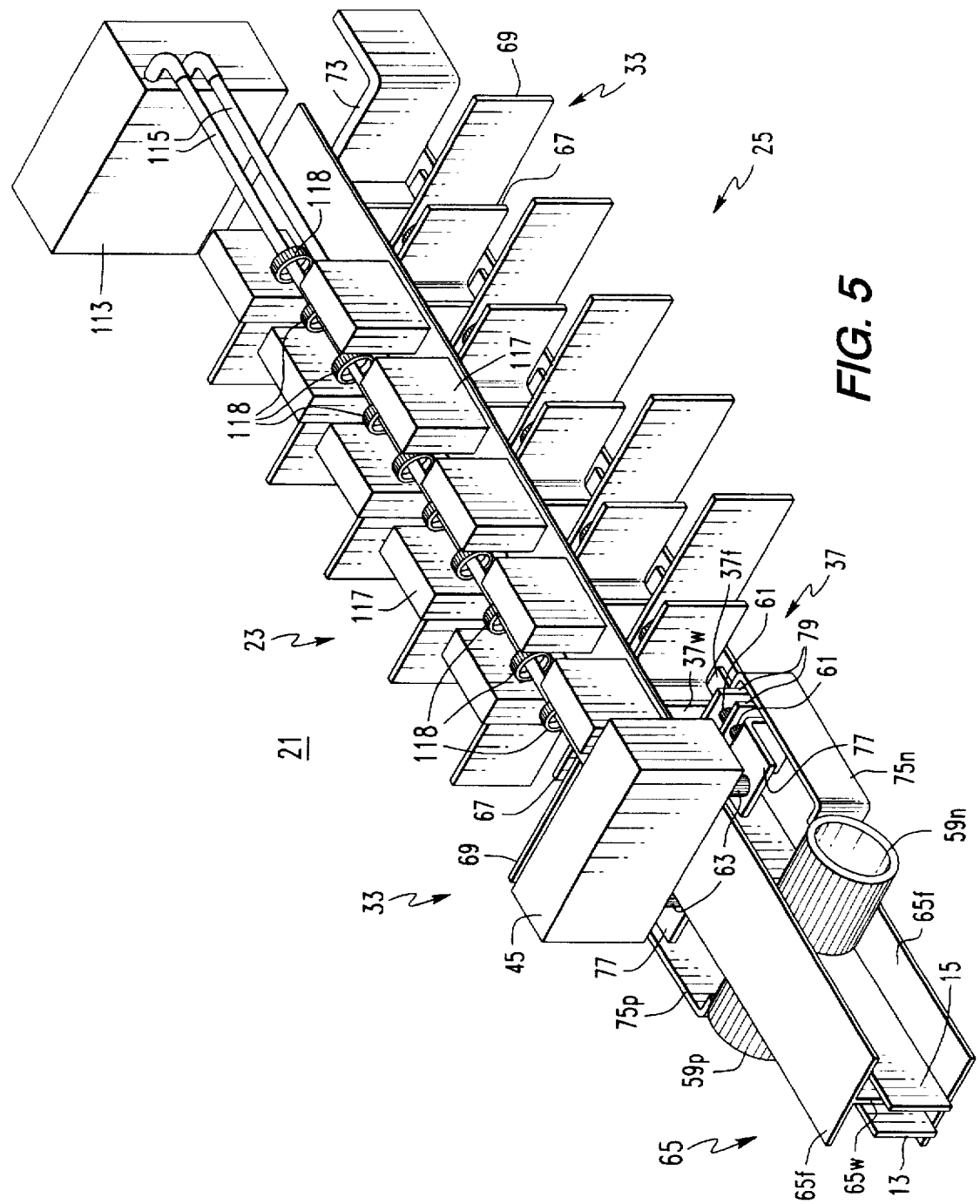
FIG. 5 is an isometric view of a switching pole in accordance with the embodiment of the invention shown in FIGS. 2 and 4 with some parts removed for clarity.
Figure 6:
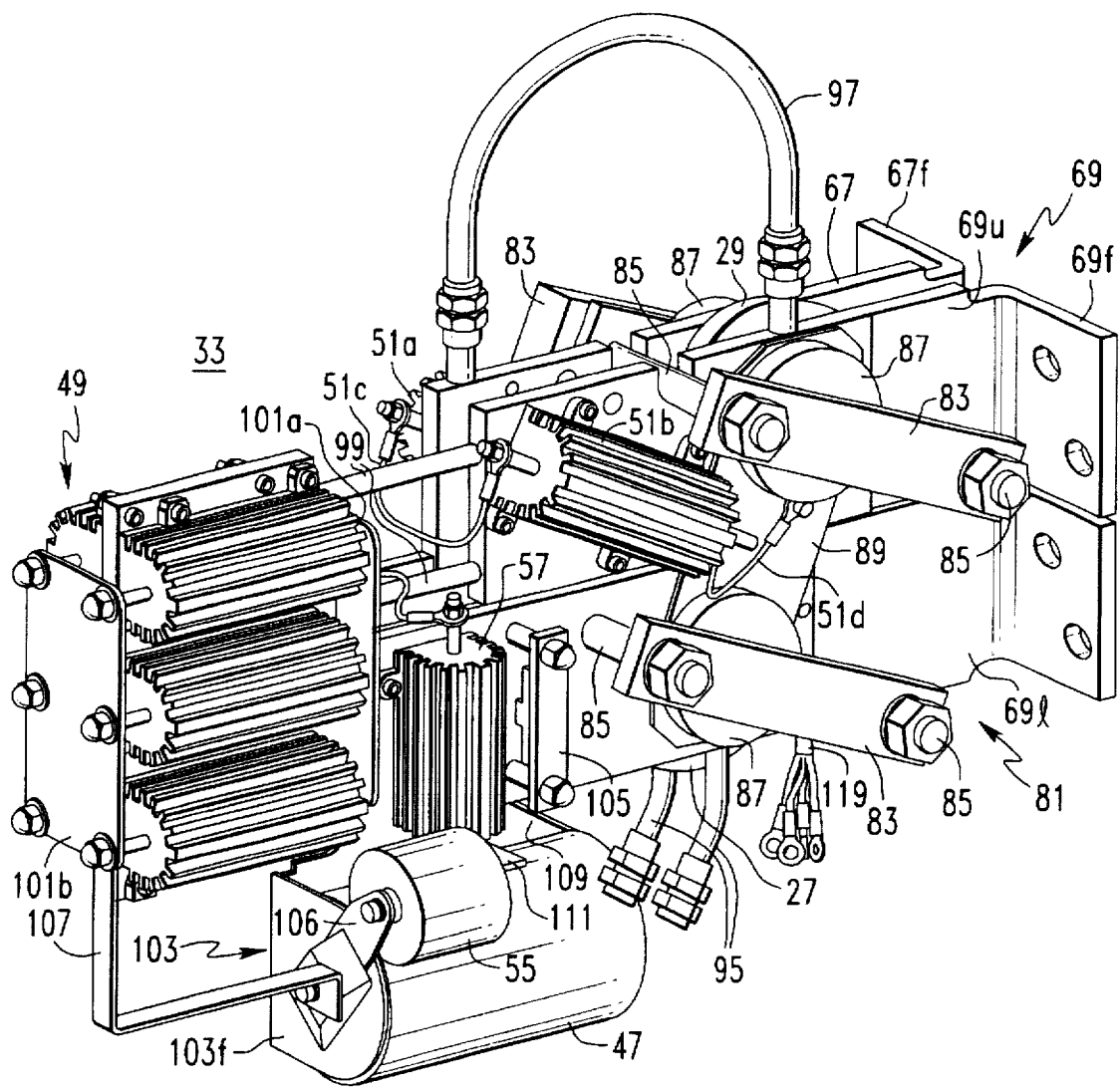
FIG. 6 is an isometric view of a modular switching unit in accordance with the invention.
Figure 9:
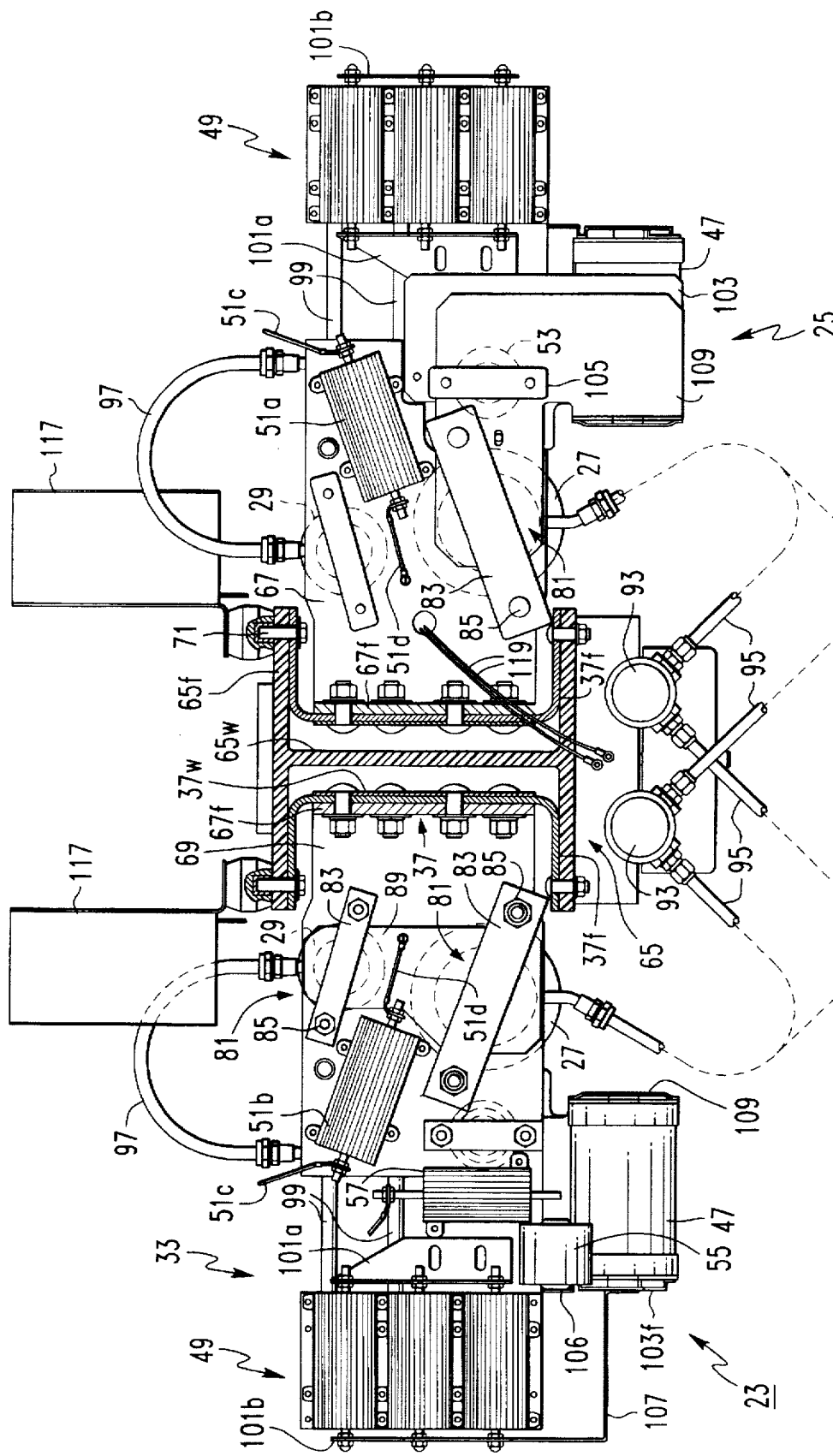
FIG. 9 is a cross section through a switching pole in accordance with the embodiment of FIG. 5 incorporating modular switching units of FIGS. 6-8.

The physical arrangement of a switching pole 21 in accordance with the first embodiment of the invention is illustrated, in simplified form in FIG. 5, and in the cross section shown in FIG. 9. The positive switching valve 23 and negative switching valve 25 are mounted back-to-back by a mounting arrangement which includes an elongated electrically insulative member in the form of a fiber glass I-beam 65. This I-beam 65 is supported with its web 65w oriented vertically and its flanges 65f extending horizontally. The switching units 33 of the positive switching valve 23 and negative switching valve 25 are modular units which include a pair of spaced apart, flat conductors 67 and 69. The additional details of the modular switching units 33 are not shown in FIG. 5 for clarity, but are described in detail below. The modular units 33 of the positive switching valve 23 and negative switching valve 25 are connected in series on opposite sides of the beam web 65w by the broad, flat connecting conductors 37. Preferably, these broad, flat connecting conductors are in the form of C-channels having a channel web 37w and flanges 37f. These connecting conductor C-channels are mounted to the I-beam 65 with the channel webs 37w adjacent the beam web 65w and with the channel flanges 37f bolted to the beam flanges 65f by fasteners 71. This arrangement permits the positive and negative switching valves 23 and 25 to be placed close together to reduce the stray loop inductance while at the same time providing electrical isolation with the flanges 65f of the I-beam providing increased creep distance between the opposite polarity switching valves. Furthermore, the C-channel connecting conductors provide stiffening for the fiber glass I-beam 65. The ratio of the width of the webs 37w of the C-channels 37 to the spacing being webs on opposite sides of the web 65w of the I-beam produces an aspect ratio of at least 1:1 and preferably 4 to 5:1 for the flat connecting conductors.

The positive and negative dc conductors 13 and 15 extend along opposite sides of the I-beam web 65 at one end of the I-beam, while the connecting plates 37 at the opposite ends of the switching valves 23 and 25 are connected to a common ac output conductor 73 at the other end of the I-beam. The di/dt reactors 59p and 59n are connected between the positive and negative dc terminal conductors 13 and 15 and the first connecting conductor of the respective switching valve by broad, flat conductors 75p and 75n. Clamping capacitor 45 is mounted on top of the I-beam 65 with the damping resistors 63 mounted between the capacitor and the dc terminal conductors by flat L conductors 77. The diode 61 are sandwiched between broad, flat conductors 79 between the clamping capacitor 45 and the switching valves 23 and 25.

Figure 7:
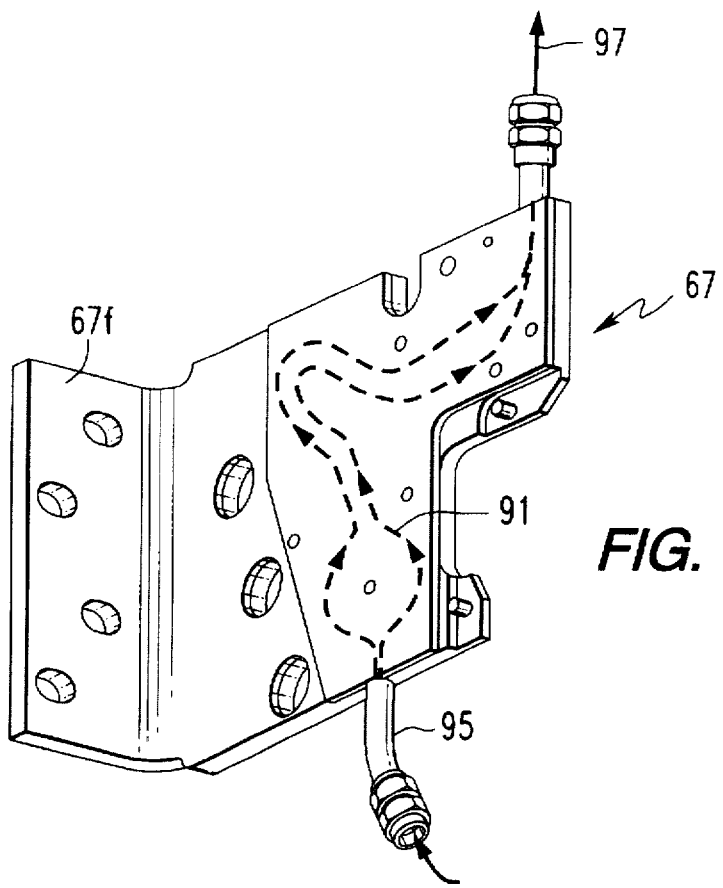
FIG. 7 is an isometric view of one flat conductor which forms a part of the modular switch unit of FIG. 6.
Figure 8:
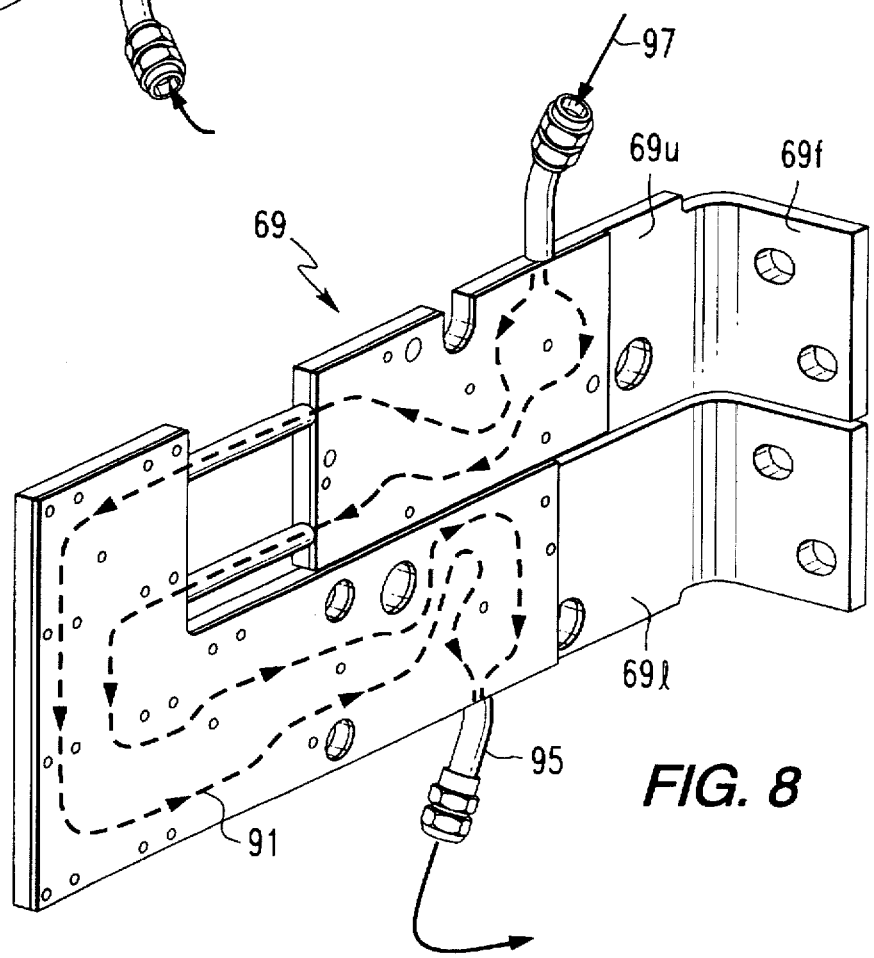
FIG. 8 is an isometric view of the other flat conductor which forms part of the modular switch unit of FIG. 6.

The details of the modular switching units are shown in FIGS. 7–9. The broad, flat conductors 67 and 69 of the modular units 33 have flanges 67f and 69f which bolt to the channel webs 37c of the connecting conductors so that the modular units 33 extend transversely outward from the I-beam 65. The switch 27, such as a GTO or IGBT, and the anti-parallel diode 29 of the switch unit are sandwiched between the flat conductors 67 and 69. This is effected by clamps 81 formed by clamping bars 83 drawn together by clamping bolts 85 which extend through apertures or slots in the flat conductors 67 and 69. Clamping plates 87 under the clamping bars 83 distribute the clamping force for better electrical and heat transfer contact between the electrical components and the flat conductors 67 and 69. A shunt plate 89 electrically connects upper and lower sections 69u and 69l of the conductor 69. In addition to providing electrical connections and mechanical support for the switches 27 and the anti-parallel diode 29, the flat conductors 67 and 69 serve as heat sinks to dissipate the considerable amount of heat generated by the high power handled by the switching units. Dissipation of heat is enhanced by circulating cooling water through passages 91 within the flat conductors 67 and 69. The cooling water is supplied through mains 93 mounted underneath the I-beam 65 (see FIG. 9). Hoses 95 connected to the mains, and connecting hose 97 connected between the conductors 67 and 69, provide a path for circulating coolant through the passages 91. The flat conductor 69 is elongated and has pipes 99 for circulating the cooling water through the remote end of the conductor. As in the case of the connecting conductors 37, the spaced apart, flat conductors 67 and 69 have an aspect ratio of width to spacing of at least 1:1, and preferably at least 4 to 5:1.

The flat conductors 67 and 69 also serve as mounts and heat sinks for the remaining components of the switching units 33. The various resistors of the switching unit are mounted in finned housings with a flat surface for engaging one of the flat conductors/heat sinks 67 or 69. The dc voltage equalizing resistor 51 is formed by two such resistors 51a and 51b bolted to the conductors 67 and 69, respectively, and connected by a lead 51c. The other ends of the resistors are connected electrically to the flat conductors 67 and 69 and, therefore, across the switch 27, by additional leads 51d. The snubber discharge resistor 49 is formed by six resistors mounted three on each side of the end of the flat conductor 69 and connected in parallel by flat conductors 101a, electrically connected to flat conductor 69, and flat conductor 101b spaced from the end of the flat conductor 69. Secondary snubber resistor 57 is mounted on the side of the flat conductor 69. The snubber capacitor 47 is supported at one end by a flat conductor 103 bent to form a supporting flange 103f. The other end of flat conductor 103 is connected to the snubber diode 53 (see FIG. 9) which is sandwiched between insulating plates (not shown) clamped between the flat conductors 67 and 69 by a clamp 105. The secondary snubber capacitor 55 is also supported by the flange 103f which forms a common electrical node through flat conductor 106. The snubber discharge resistors 49 are connected to this common node by the flat conductor 107. The other end of the snubber capacitor 47 is supported by a flat conductor 109 suspended from the other flat conductor/heat sink 67. The other end of the secondary snubber capacitor 55 is connected to the damping resistor 57 by a flat conductor 111. These connections implement the module circuits shown in FIG. 4. The flat conductors used throughout help to reduce the stray inductance and, therefore, the overshoot voltage during switching.

Returning to FIG. 5, a pole electronics box 113 generates high frequency (e.g. 20 kHz) power for operating the pole switch units 33. This power is delivered over power leads 115 extending along the top of the I-beam 65 to individual control boxes 117 for each of the modular switching units. These control boxes 117, which are also mounted on top of the I-beam by the fasteners 71, draw power from the leads 115 through current transformers 118 which provides good electrical isolation between units. The control boxes 117 generate the signals on leads 119 which control the states of the switches 27 of the associated modular units 33 in response to firing signals generated by a control system (not shown) and transmitted to the control boxes 117.

Figure 10:
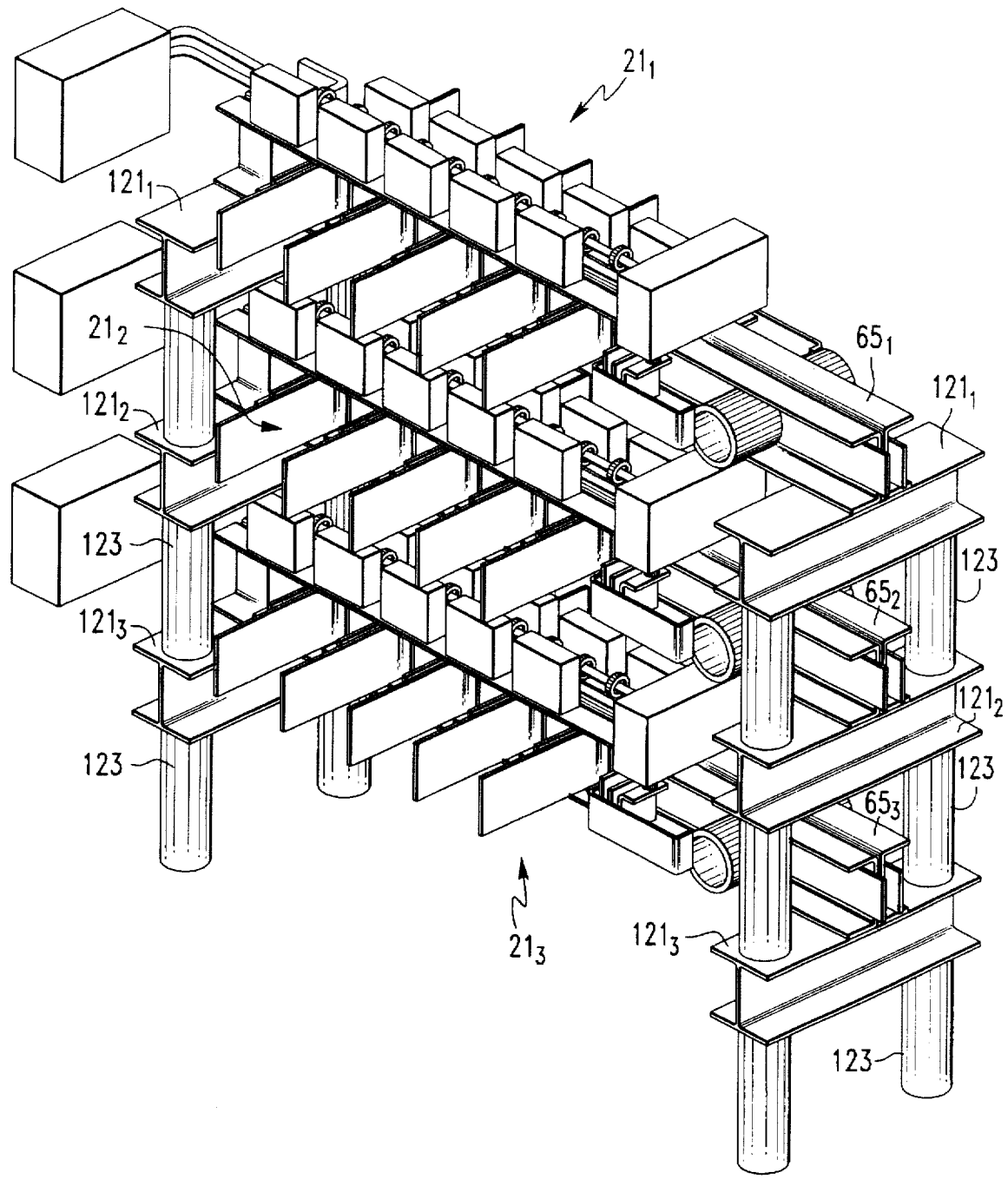
FIG. 10 is an isometric view of three stacked switching poles in accordance with the invention forming a six-pulse inverter bridge.

FIG. 10 shows how three poles $2_1$ to $2_3$ can be stacked to form a six-pulse inverter bridge. The I-beams $65_1$ to $65_3$ of the respective poles are supported at each end by a transverse I-beam section $121_1$ to $121_3$. Each end of each of the transverse I-beam sections 121 is supported by an insulative column 123. Multiple six pulse inverter bridges 125, such as shown in FIG. 10, can be combined to produce a harmonic neutralized stepped approximation of a sinewave, which can be used, for instance, in providing compensation in an electric power transmission or distribution system.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Switching pole for a high power electronic voltage sourced inverter connected between an ac bus forming an ac terminal and a dc-source having a positive dc bus and a negative dc bus positioned to form closely spaced positive and negative dc terminals, said switching pole comprising:

a positive switching valve comprising a first set of switching units and a first set of connecting conductors connecting said first set of switching units in series to form a positive electrical path between said positive dc terminal and said ac terminal;

a negative switching valve comprising a second set of switching units and a second set of connecting conductors connecting said second set of switching units in series to form a negative electrical path between said negative dc terminal and said ac terminal;

mounting means mounting said positive switching valve and said negative switching valve so that said positive electrical path and said negative electrical path form a loop having a minimum loop area, wherein said first and second set of connecting conductors in said positive switching valve and said negative switching valve each comprise broad, flat conductors having an aspect ratio of width to spacing between facing connecting conductors in said loop of at least about 1:1; and limiter means limiting electrical parameters of said positive and negative electrical paths connected to said positive and negative switching valves.

2. The switching pole of claim 1 wherein said mounting means comprises electrically insulative means supporting said positive switching valve and said negative switching valve with said positive and negative electrical paths back-to-back in close parallel relationship between said dc terminals and said ac terminal.

3. The switching pole of claim 2 wherein said mounting means includes an elongated electrically insulative member extending between said back-to-back positive and negative electrical paths.

4. The switching pole of claim 1 wherein said mounting means includes electrically insulative means supporting said positive switching valve with said positive electrical path having two sections folded back on each other between said positive dc terminal and said ac terminal, and supporting said negative switching valve with said negative electrical path having two sections folded back on each other between said negative dc terminal and said ac terminal.

5. The switching pole of claim 4 wherein said first set of connecting conductors and said second set of connecting conductors are each comprised of broad, flat conductors having an aspect ratio of width to spacing in said folded back sections of at least 1:1.

6. The switching pole of claim 1 wherein said switching units each comprise a gate controlled electronic switch shunted by an anti-parallel diode and wherein said limiter means comprises a first current limiting reactor connected in series with said positive switching valve and a second current limiting reactor connected in series with said negative switching valve.

7. The switching pole of claim 1 wherein said switching units each comprise a gate controlled electronic switch and wherein said limiter means comprises a voltage limiting capacitor connected between said closely spaced dc terminals.

8. The switching pole of claim 7 wherein said switching units further comprise an anti-parallel diode shunting said gate controlled electronic switch and wherein said limiter means further comprises a first di/dt current limiting air core reactor connected between said positive dc terminal and said positive switching valve, a second current limiting air core reactor connected between said negative dc terminal and said negative switching valve, and recirculating means shunting said first and second current limiting air core reactors.

9. The switching pole of claim 1 wherein said aspect ratio is at least about 4:1.

10. The switching pole of claim 1 wherein said mounting means comprises an insulative I-beam having a beam web and beam flanges send said connecting conductors comprise channel members having a channel web and channel flanges, said mounting means further including fastener means mounting said channel members to said I-beam with said channel webs adjacent said beam web and said channel flanges adjacent said beam flanges.

11. The switching pole of claim 1 wherein said switch units of said positive switching valve and said negative switching valve are modular switch units.

12. The switching pole of claim 11 wherein said connecting conductors of said positive switching valve and said negative switching valve comprise broad, flat connecting conductors and wherein said modular switching units each comprise a switch, an anti-parallel diode shunting said switch and a pair of spaced apart, flat conductors extending generally transverse to said flat connecting conductors, said switch and said anti-parallel diode being sandwiched between said pair of spaced apart, flat conductors which serve as electrical conductors and heat sinks for said switch and said anti-parallel diode.

13. The switching pole of claim 12 wherein said spaced apart, flat conductors have passages therethrough for circulating coolant to cool said switch and anti-parallel diode.

14. The switching pole of claim 13 wherein one of said flat connecting conductors and said spaced apart, flat conductors of said modular switching units have flanges thereon which engage the other of said flat connecting conductors and spaced apart, flat conductors.

15. The switching pole of claim 13 wherein said modular switching units further include snubber components connected between said spaced apart, flat conductors.

16. The switching pole of claim 12 wherein said mounting means comprises an elongated electrically insulative member extending between said ac terminal and said dc terminals and having a first side from which said modular switching units project laterally outward and along which said first set of flat connecting conductors extend, and a second side from which said modular switching units of said negative switching valve project outward and along which said second set of flat connecting conductors extend.

17. The switching pole of claim 16 wherein said elongated insulating member comprises an insulative I-beam having a beam web and beam flanges and wherein said broad, flat connecting conductors comprise C-channels having a channel web and channel flanges, and said mounting means further includes fastener means securing said C-channels of said first set of connecting conductors on one side of said beam web with said channel webs adjacent said beam web and said channel flanges adjacent said beam flanges and with said C-channels of said second set of connecting conductors on the other side of said beam web with said channel webs adjacent said beam web and said channel flanges adjacent said beam flanges.

18. The switching pole of claim 17 wherein said pair of spaced apart, flat conductors of said switching units have terminal flanges thereon and said mounting means further include means securing said terminal flanges of said pair of spaced apart, flat conductors to said channel webs of adjacent connecting conductors.

19. The switching pole of claim 16 wherein said limiter means comprises a voltage limiting capacitor connected by flat conductors between said closely spaced positive and negative dc terminals.

20. The switching pole of claim 19 wherein said limiting means further includes a first air core reactor connected between said positive dc terminal and said positive switching valve, and a second air core reactor connected between said negative dc terminal and said negative switching valve.

21. The switching pole of claim 20 wherein said limiting means further includes clamping diodes connected by flat conductors between said capacitor and said positive switching valve and between said capacitor and said negative switching valve and across said first and second air core reactors.

22. A multi-pole, high voltage, electronic, voltage sourced inverter bridge connected between a multi-phase ac bus forming ac terminals and a dc-source having a positive dc bus and a negative dc bus positioned to form closely spaced positive and negative dc terminals, said inverter comprising:

a plurality of switching poles, each comprising:

a positive switching valve comprising a first set of switching units and a first set of connecting conductors connecting said first set of switching units in series to form a positive electrical path between said positive dc terminal and a selected one of said ac terminals;

a negative switching valve comprising a second set of switching unit and a second set of connecting conductors connecting said second set of switching units in series to form a negative electrical path between said negative dc terminal and said selected ac terminal;

limiter means limiting electrical parameters of said positive and negative electrical paths connected to said positive and negative switching valves; and mounting means mounting said positive switching valve and said negative switching valve of each of said switching poles so that the positive electrical path and the negative electrical path form a minimal loop area, and with said switching poles stacked one on top of another, wherein said first and second set of connecting conductors in said positive switching valve and said negative switching valve each comprise broad, flat conductors having an aspect ratio of width to spacing between facing connecting conductors in said loop of at least about 1:1.

23. The multi-pole, high voltage, electronic voltage sourced inverter of claim 22 wherein said mounting means comprises for each pole, an elongated electrically insulative member supporting said positive switching valve and said negative switching valve with said positive and negative electrical paths back-to-back in close parallel relationship between said dc terminals and said selected ac terminal, and support means stacking said elongated electrically insulative members vertically.

24. A modular switch unit for a switching pole for a high power electronic voltage sourced inverter comprising:

a gate controlled switch;

an anti-parallel diode shunting said gate controlled switch;

a pair of spaced apart, flat conductors having an aspect ratio of width to spacing therebetween of at least about 1:1; and clamping means clamping said gate controlled switch and anti-parallel diode in parallel between said flat conductors, said flat conductors serving as electrical leads and heat sinks for said gate controlled switch and anti-parallel diode.

25. The modular switch unit of claim 24 wherein said flat conductors include passages through which coolant is circulated to carry away heat generated by said gate controlled switch and anti-parallel diode.

26. The modular switch unit of claim 25 wherein said flat conductors each have on one end an outwardly extending flange for mounting said modular switch unit.

27. The modular switch unit of claim 26 including limiter means for limiting voltage overshoot across said gate controlled switch connected to and supported by said flat conductors.

28. The modular switch unit of claim 24 wherein said aspect ratio is at least about 4:1.

* * * * *

UNITED STATES PATENT AND TRADEMARK OFFICE
CERTIFICATE OF CORRECTION

PATENT NO. : 5,798,916
DATED : August 25, 1998
INVENTOR(S) : Eric John Stacey and George Studley Bettencourt It is certified that error appears in the above-indentified patent and that said Letters Patent is hereby corrected as shown below:

Claim 22, line 14, change "unit" to -- units --.

Signed and Sealed this

Ninth Day of November, 1999

Attest:

Q. TODD DICKINSON

Attesting Officer

Acting Commissioner of Patents and Trademarks